United States Patent
Suda et al.

(10) Patent No.: US 10,265,922 B2
(45) Date of Patent: Apr. 23, 2019

(54) FLUOROPOLYMER MOLDED ARTICLE

(75) Inventors: Takahide Suda, Sizuoka (JP); Takao Nishio, Sizuoka (JP); Kenta Yamamoto, Yokohama (JP); Yuto Moritani, Yokohama (JP); Tatsuo Tomizawa, Tokyo (JP); Torao Iida, Tokyo (JP); Takashi Nihongi, Tokyo (JP)

(73) Assignees: CHEMOURS-MITSUI FLUOROPRODUCTS CO., LTD., Minato-Ku, Tokyo (JP); NICHIAS CORPORATION, Chuo-Ku, Tokyo (JP)

( * ) Notice: Subject to any disclaimer, the term of this patent is extended or adjusted under 35 U.S.C. 154(b) by 549 days.

(21) Appl. No.: 14/348,286

(22) PCT Filed: Jul. 27, 2012

(86) PCT No.: PCT/JP2012/069778
§ 371 (c)(1),
(2), (4) Date: Jun. 2, 2014

(87) PCT Pub. No.: WO2013/046923
PCT Pub. Date: Apr. 4, 2013

(65) Prior Publication Data
US 2014/0287177 A1 Sep. 25, 2014

(30) Foreign Application Priority Data
Sep. 28, 2011 (JP) ................... 2011-212653

(51) Int. Cl.
*B32B 1/02* (2006.01)
*B32B 1/00* (2006.01)
(Continued)

(52) U.S. Cl.
CPC ............... *B32B 1/02* (2013.01); *B29C 45/00* (2013.01); *B29C 45/0001* (2013.01); *B32B 1/00* (2013.01);
(Continued)

(58) Field of Classification Search
CPC .... B32B 1/00; B32B 1/02; B32B 1/08; B29C 45/00; B29C 45/0001; Y10T 428/1352;
(Continued)

(56) References Cited

U.S. PATENT DOCUMENTS 4,879,362 A * 11/1989 Morgan ................ C08F 214/26
428/407
5,473,018 A 12/1995 Namura et al.
(Continued)

FOREIGN PATENT DOCUMENTS

JP H07-70397 A 3/1995
JP 10-86205 A 4/1998
(Continued)

OTHER PUBLICATIONS

NEOFRON™ PFA AP-202, Japan, Nov., 2008, ver.01. (1 page).
(Continued)

*Primary Examiner* — Walter Aughenbaugh
(74) *Attorney, Agent, or Firm* — Buchanan, Ingersoll & Rooney PC

(57) ABSTRACT

Provided is a large-size injection molded article which is obtained by injection molding a composition containing a heat-meltable fluoropolymer. Specifically, provided is a large-size injection molded article, which can be molded at a lower injection pressure as compared with a conventional PFA and obtained by molding a composition superior in mold release characteristics from a metal mold. This large-size injection molded article is superior in, particularly, heat resistance and chemical resistance, as well as dimensional accuracy, for a substrate processing apparatus.

(Continued)

Provided is an injection molded article, having a projection area in an injection direction of 1100 cm$^2$ or more, obtained by injection molding a composition containing a heat-meltable fluoropolymer. It is a preferable aspect that the composition including a heat-meltable fluoropolymer is a composition containing a melt moldable tetrafluoroethylene/fluoroalkoxytrifluoroethylene copolymer having an MFR over 60 g/10 minutes.

9 Claims, 4 Drawing Sheets

(51) Int. Cl.
| | |
|---|---|
| B29C 45/00 | (2006.01) |
| C08F 14/26 | (2006.01) |
| C08L 27/18 | (2006.01) |
| H01L 21/67 | (2006.01) |
| B29K 27/12 | (2006.01) |
| B29L 31/00 | (2006.01) |

(52) U.S. Cl.
CPC ............. *C08F 14/26* (2013.01); *C08L 27/18* (2013.01); *B29K 2027/12* (2013.01); *B29K 2995/0058* (2013.01); *B29L 2031/7126* (2013.01); *C08L 2205/025* (2013.01); *C08L 2205/14* (2013.01); *H01L 21/6719* (2013.01); *Y10T 428/139* (2015.01); *Y10T 428/1352* (2015.01); *Y10T 428/1372* (2015.01); *Y10T 428/1379* (2015.01); *Y10T 428/1397* (2015.01)

(58) Field of Classification Search
CPC ......... Y10T 428/1372; Y10T 428/1379; Y10T 428/139; Y10T 428/1393; Y10T 428/1397
See application file for complete search history.

(56) References Cited

U.S. PATENT DOCUMENTS

| | | | |
|---|---|---|---|
| 5,603,999 | A | 2/1997 | Namura et al. |
| 6,416,840 | B1 | 7/2002 | Miyamori et al. |
| 2002/0028895 | A1 | 3/2002 | Iwasaki et al. |
| 2003/0114615 | A1 | 6/2003 | Sumi et al. |
| 2004/0232584 | A1 | 11/2004 | Johnson |
| 2005/0020792 | A1 | 1/2005 | Aoyama et al. |
| 2006/0185695 | A1 | 8/2006 | Kato |
| 2007/0149734 | A1 | 6/2007 | Sakakibara et al. |
| 2007/0219333 | A1* | 9/2007 | Shimono ............... C08F 214/24 526/249 |
| 2008/0081182 | A1 | 4/2008 | Nam et al. |
| 2008/0176048 | A1* | 7/2008 | Onizawa ............. B29C 45/0001 428/195.1 |

FOREIGN PATENT DOCUMENTS

| | | |
|---|---|---|
| JP | 11-297652 A | 10/1999 |
| JP | 2002-3514 A | 1/2002 |
| JP | 2002-53620 A | 2/2002 |
| JP | 3559062 B2 | 8/2004 |
| JP | 2005-507803 A | 3/2005 |
| JP | 2006-229020 A | 8/2006 |
| JP | 2007-500853 A | 1/2007 |
| JP | 2007-119781 A | 5/2007 |
| JP | 2007-262222 A | 10/2007 |
| JP | 2008-004890 A | 1/2008 |
| JP | 2008-081224 A | 4/2008 |
| JP | 2008-88306 A | 4/2008 |
| JP | 2009-218249 A | 9/2009 |
| JP | 2010-180365 A | 8/2010 |
| JP | 2010-254973 A | 11/2010 |
| JP | 4591352 B2 | 12/2010 |
| JP | 4703944 B2 | 6/2011 |
| KR | 10-2007-0009691 A | 1/2007 |
| KR | 10-2007-0120104 A | 12/2007 |
| WO | WO 96/14359 A1 | 5/1996 |
| WO | WO 03/039838 A1 | 5/2003 |
| WO | WO 03/048214 A1 | 6/2003 |
| WO | 2005/052015 A1 | 6/2005 |

OTHER PUBLICATIONS

Office Action dated Jul. 14, 2015, by the Japanese Patent Office in corresponding Japanese Patent Application No. 2011-212653. (3 pages).

International Search Report (PCT/ISA/210) dated Nov. 6, 2012, by the Japanese Patent Office as the International Searching Authority for International Application No. PCT/JP2012/069778.

Practical Handbook for Fluorine Contained Resin, Dupont-Mitsui Fluorochemicals Co., Ltd., Jul. 2010, pp. 43-44, vol. 110, No. 4.

Comprehensive Laboratory Equipment & Supplies 2011, Japan, As One, Sep. 2010, p. 885.

Japanese Industrial Standard (JIS) No. p. 8115, 2001: "Paper and board—Determination of folding endurance—MIT method". (12 pages).

Office Action dated Mar. 1, 2016, by the Japanese Patent Office in corresponding Japanese Patent Application No. 2011-212653. (6 pages).

Notification of Reasons for Refusal dated Aug. 8, 2017, by the Japanese Patent Office in corresponding Japanese Patent Application No. 2016-218525 and an English translation of the Notification. (9 pages).

ASTM International: "Standard Specification for Perfluoroalkoxy (PFA)-Fluorocarbon Resin Molding and Extrusion Materials," pp. 294-299 (6 pages), date not available.

Notification of Reason for Refusal issued by the Korean Intellectual Property Office in corresponding Korean Patent Application No. 10-2014-7008024 dated Jun. 22, 2018 (7 pages including partial English translation).

* cited by examiner

FLUOROPOLYMER MOLDED ARTICLE

TECHNICAL FIELD

The present invention relates to an injection molded article (container-like article) suitable to use as a substrate processing apparatus for cleaning substrate by supplying a processing liquid or an inert gas to a substrate such as a semiconductor substrate, a glass substrate for a liquid crystal display device, a glass substrate for a photo-mask, a substrate for an optical disk (hereafter it may be referred to simply as "substrate"). In particular, the present invention relates to a container-like article obtained by injection molding a composition including a tetrafluoroethylene/fluoroalkoxytrifluoroethylene copolymer.

BACKGROUND ART

In a manufacturing step of an electronic substrate such as a semiconductor manufacturing apparatus and a liquid crystal manufacturing apparatus, there is generated a residue of photoresist, a residue of an organic solvent, a synthetic wax, an organic residue of fatty acids and the like from a human body, an inorganic residue such as sodium, potassium, gold, iron and copper, as well as a contaminant such as fine particles, which must be removed so as not to be entrained to the subsequent steps. Accordingly, a cleaning and drying processing step, composed of chemicals processing using the chemicals or rinsing processing using rinsing liquid such as pure water, has become important, as technology for maintaining the substrate surface highly clean and efficiently removing the contaminants.

The apparatus described in PATENT LITERATURE 1 is a substrate cleaning apparatus for cleaning the substrate. The apparatus includes a means for rotating and holding substrate that holds and rotates the substrate, a means for supplying a cleaning liquid that supplies chemicals and rinsing liquid as a cleaning liquid to the substrate held by the means for rotating and holding substrate, and a member to contact with the cleaning liquid scattering from the substrate which is rotated by the means for rotating substrate. In PATENT LITERATURE 1, chemicals processing using the chemicals, and rinsing processing using pure water, etc. are performed to the substrate, while rotating the substrate holding parts and an atmosphere shielding plate.

In such an apparatus for performing the cleaning of the substrate, removal of contaminants adhered to the substrate is performed by supplying the chemicals like an acidic solution such as nitric acid aqueous solution, hydrochloric acid aqueous solution, hydrofluoric acid aqueous solution and mixed hydrofluoric acid aqueous solution (mixing of hydrogen peroxide water with hydrofluoric acid water) or an alkaline solution such as ammonia water and SC-1 (mixed solution of ammonia water and hydrogen peroxide water), or pure water toward the substrate held at the substrate holding unit, (hereinafter, an acidic solution or an alkaline solution is sometimes referred to as "chemicals", in addition, pure water and chemicals are sometimes referred to as collectively "processing liquid"). Therefore, it has been known that the chemicals adheres to the substrate holding parts or an inert gas passage, and thus corrosion of the part adhered with the chemicals causes processing defect of the substrate.

Accordingly, it has been proposed to form a member of a processing apparatus to which the relevant chemicals adheres, using a resin having heat resistance and chemical resistance, to solve such processing defect of the substrate caused by such corrosion due to the chemicals, and as such a resin, there is included, for example, a fluoropolymer such as a tetrafluoroethylene resin (PTFE), a tetrafluoroethylene/fluoroalkoxytrifluoroethylene copolymer (PFA) (refer to PATENT LITERATURES 1 and 2). In particular, a bottle or a tube obtained by melt-extrusion molding of PFA, having a melt moldability, and being superior in heat resistance and chemical resistance, has been utilized as a container of a high purity chemicals for semiconductor manufacturing or a piping for transferring the chemicals or ultrapure water, respectively (refer to PATENT LITERATURE 3).

However, in recent years, as for a processing tank or the like in the substrate processing apparatus, where a plurality of processing liquids are supplied, there have been progressing the large sizing accompanying with a large-sized wafer, as well as shape complication or increase in parts number accompanying with multi-functionalization of washing or cleaning process, while high dimensional accuracy has been required.

To satisfy these requirements, the above processing tank or the like has been manufactured by cutting a large-size material of polytetrafluoroethylene (PTFE). However, such a method for obtaining a finished product of a processing tank has problems of low production efficiency, as well as an inevitable cutting waste of most part of the material, because it requires passing through long steps such as compression molding, sintering, cutting and annealing of a material block.

There has been attempted to obtain a material having a shape as near as possible to a final shape, using isostatic pressing or the like, to reduce cutting loss due to this cutting waste of PTFE, however, even by such a way, molding steps, which include compression molding, sintering, cutting and accompanying annealing and the like of a material block, require several months, and cutting loss (amount of cutting waste) also amounts over 50%.

In addition, in the case of attempting to obtain a large-sized processing tank, as described above, by injection molding, using PFA having chemical resistance and heat resistance equivalent to those of PTFE, and being heat meltable, for example, PFA having particular molecular weight distribution and melt flow rate (MFR) (35 to 60 g/10 minutes) at 372° C., measured in accordance with ASTM D-3307 as described in PATENT LITERATURE 4, or PFA having specific volume flow rate, as described in PATENT LITERATURE 5, it was difficult to obtain a large-size molded article by injection molding, because of not able to maintain enough injection pressure till the end of molding metal mold.

Obtaining the large-sized molded article of PFA by injection molding requires high injection pressure and clamping pressure, because PFA has higher melt viscosity as compared with other engineering plastics, therefore, there was a problem of requiring a very large-size injection molding machine. Accordingly, it has been impossible to obtain a large-size molded article of PFA by injection molding, because of hike of initial introduction cost and product cost, resulting in poor profitability, as well as difficulty in obtaining a practical large-size article.

In the case of obtaining a product, by subdividing parts of a large-sized tank or the like as described above to a size moldable by an existing PFA injection molding, molding the parts by an injection molding machine, and then by melt-adhering or welding them, there was a problem like generation of deformation by stress concentration at the melt-adhered or welded part, caused by thermal expansion in use of the product under high temperature atmosphere.

Still more, other melt molding methods, such as transfer molding, rotational molding and blow molding, have been attempted. However, for example, in the case of obtaining the above processing tank or the like by rotational molding, there were problems of poor cost reducing effect and low production efficiency, because of not satisfying high dimensional accuracy desired, resulting in many additional steps.

CITATION LIST

Patent Literature

PATENT LITERATURE 1: JP-A-11-297652
PATENT LITERATURE 2: JP No. 4703944
PATENT LITERATURE 3: JP No. 3559062
PATENT LITERATURE 4: JP-A-2002-53620
PATENT LITERATURE 5: JP-A-10-86205

SUMMARY OF INVENTION

Problems to be Resolved by Invention

The present invention provided a large-size injection molded article obtained by injection molding a composition including a heat-meltable fluoropolymer, by solving the problems of the above conventional technology.

The present invention provides a large-size injection molded article, which is superior in particularly heat resistance and chemical resistance, as well as dimensional accuracy, obtained by molding a composition superior in mold release characteristics from a metal mold, which can be molded at a lower injection pressure as compared with a conventional PFA. A large-size injection molded article provided by the present invention, is particularly suitable as a member of substrate processing apparatus.

The present invention also provides a large-sized molded article with a complicated shape by injection molding a composition including PFA.

Means for Resolving Problems

There is provided an injection molded article, having a projection area of 1100 $cm^2$ or more, obtained by injection molding a composition including a heat-meltable fluoropolymer.

The above injection molded article, having an injection area diffusion ratio in a direction orthogonal to an injection direction of 3000 or larger, is a preferable embodiment of the present invention.

The above injection molded article, having a cylinder-shape, a square-shape, a container-shape, a box-shape or a basket-shape, is a preferable embodiment of the present invention.

The above injection molded article, used as a member or a housing thereof, for a semiconductor manufacturing apparatus or a substrate cleaning processing apparatus, is a preferable embodiment of the present invention.

The above injection molded article, wherein the heat-meltable fluoropolymer is at least one kind selected from the group of a tetrafluoroethylene copolymer, an ethylene/chlorotrifluoroethylene copolymer, and polyvinylidene fluoride, is a preferable embodiment of the present invention.

The above injection molded article, wherein the composition including the heat-meltable fluoropolymer is a composition containing a tetrafluoroethylene/fluoroalkoxytrifluoroethylene copolymer having the MFR over 60 g/10 minutes as the heat-meltable fluoropolymer, and further containing a polytetrafluoroethylene having a crystallization temperature of 305° C. or higher and a heat of crystallization of 50 J/g or higher, in an amount of 0.05 to 10% by weight, relative to the composition, is a preferable embodiment of the present invention.

Effects of Invention

According to the present invention, it is possible to mold a composition (a composition including PFA), superior in mold release characteristics from a metal mold, at a lower injection pressure as compared with a conventional PFA, and is possible, in particular, to provide a large-size injection molded article, superior in heat resistance and chemical resistance, as well as dimensional accuracy.

In addition, according to the present invention, since it is possible to perform injection molding of a large-sized molded article with a complicated shape, production efficiency can be enhanced by shortening production steps of a product and in addition by decreasing cutting waste amount.

The large-size injection molded article of the present invention, due to being superior in heat resistance and chemical resistance as well as having suppressed production cost, can be applied to wide usages such as a member for a semiconductor manufacturing apparatus, and others including a chemical corrosion protection application, an OA application, a sliding material application, an automotive application, a construction material application, or the like.

DESCRIPTION OF EMBODIMENTS

Figure 1:
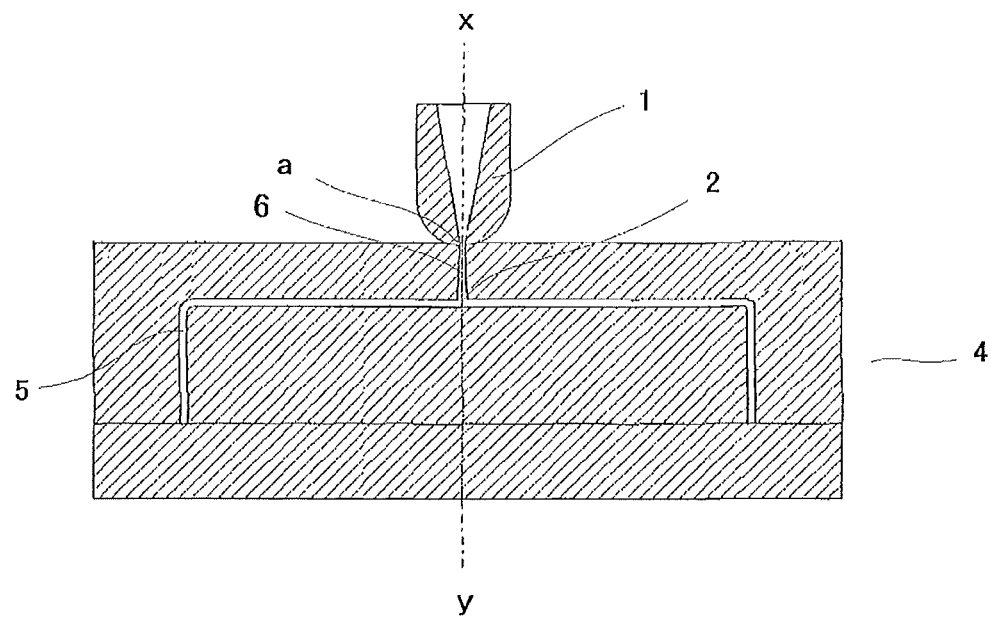
FIG. 1 is a cross-sectional view showing one example of a metal mold to obtain an injection molded article of the present invention.

Explanation will be given below in detail on embodiments of the present invention.

The heat-meltable fluoropolymer in the present invention is a fluoropolymer which is capable of melt-molding. As the preferable example thereof, there can be included at least one kind selected from a tetrafluoroethylene/fluoroalkoxytrifluoroethylene copolymer, an ethylene/chlorotrifluoroethylene copolymer, and polyvinylidene fluoride. Among them, as a preferable one, tetrafluoroethylene/fluoroalkoxytrifluoroethylene copolymer can be cited.

In tetrafluoroethylene/fluoroalkoxytrifluoroethylene copolymer of the present invention, a content of fluoroalkoxytrifluoroethylene is 1 to 10% by weight. Fluoroalkoxy trifluoroethylene, which can be used as a co-monomer, includes perfluoroalkene, having 3 or more carbon numbers, preferably 3 to 6 carbon numbers; perfluoro (alkyl vinyl ether) having 1 to 6 carbon numbers, or the like, and preferably includes perfluoro (methyl vinyl ether) (hereinafter, abbreviated as PMVE), perfluoro (ethyl vinyl ether) (hereinafter, abbreviated as PEVE), perfluoro (propyl vinyl ether) (hereinafter, abbreviated as PAVE), or the like.

It is preferable that a tetrafluoroethylene/fluoroalkoxytrifluoroethylene copolymer in the present invention is tetrafluoroethylene/perfluoro (alkyl vinyl ether)copolymer (hereafter it is abbreviated as PFA).

A tetrafluoroethylene/fluoroalkoxytrifluoroethylene copolymer in the present invention is capable of melt molding such as melt extrusion molding or injection molding, and it is preferable to have a melt flow rate (MFR) at 372° C.±1° C. of over 60 g/10 minutes and 100 g/10 minutes or lower, and more preferably of 70 to 80 g/10 minutes. The MFR of 60 g/10 minutes or less tends to make difficult to maintain injection pressure till the end of molding metal mold, and thus makes difficult to obtain a molded article having a projection area of 1100 cm$^2$ or more by injection molding, which is obtainable in the present invention. In addition, the MFR over 100 g/10 minutes makes difficult to maintain the shape of a molded article. As the copolymer of the present invention, it is desirable to select the copolymer that can be produced by a known method such as solution polymerization, emulsion polymerization and suspension polymerization, and has a flex life value of at least 1000 or higher.

In addition, as for a tetrafluoroethylene/fluoroalkoxytrifluoroethylene copolymer of the present invention, several kinds of said copolymers having different MFR can be mixed and used, so as to attain a melt flow rate (MFR) at 372° C.±1° C. of over 60 g/10 minutes and 100 g/10 minutes or lower, and more preferably a melt flow rate (MFR) of 70 to 80 g/10 minutes. For example, it is possible to use by mixing PFA having the MFR less than 60 g/10 minutes and PFA having the MFR over 60 g/10 minutes, and by adjusting an MFR of the PFA mixture within the above range.

In the present invention, a composition including the heat-meltable tetrafluoroethylene/fluoroalkoxytrifluoroethylene copolymer having an MFR over 60 g/10 minutes may contain PTFE. The PTFE to be mixed is a homopolymer of tetrafluoroethylene and/or a modified PTFE including small amount of comonomer in an amount of 1% by weight or less (hereafter, it may be referred to correctively as "PTFE" including the modified PTFE). A small amount of comonomer includes perfluoroalkene having 3 or more carbon numbers, preferably 3 to 6 carbon numbers; perfluoro (alkyl vinyl ether) having 1 to 6 carbon numbers; chlorotrifluoroethylene, or the like. A suitable specific example of fluorine-containing monomer can include hexafluoropropylene (HFP), perfluoro (methyl vinyl ether) (PMVE), perfluoro (ethyl vinyl ether) (PEVE), perfluoro (propyl vinyl ether) (PPVE), and perfluoro (butyl vinyl ether) (PBVE), chlorotrifluoroethylene. Among them, hexafluoropropylene (HFP), perfluoro (ethyl vinyl ether) (PEVE) and perfluoro (propyl vinyl ether) (PPVE) are preferable, and particularly, hexafluoropropylene (HFP) can be cited.

As such PTFE, for example, there can be cited PTFE having the MFR of 0.01 to 1.0 g/10 minutes, called, "PTFE micro-powder" or "PTFE-wax". The MFR of PTFE below 0.01 g/10 minutes could cause extreme decrease of the MFR of the PFA composition, and the MFR of PTFE over 1.0 g/10 minutes could deteriorate durability of the obtained injection molded article, as well as could not provide smooth surface, due to decrease in effect on crystallization of PFA by the addition of PTFE.

In addition, it is preferable that PTFE to be mixed in the present invention satisfies two requirements, that are, a crystallization temperature, measured using a differential scanning calorimeter (DSC) by a method to be described later, of 305° C. or higher, and a heat of crystallization of 50 J/g or higher. It is desirable that crystallization temperature of PTFE is 305° C. or higher, preferably 310° C. or higher, and more preferably 312° C. or higher. The case of crystallization temperature of PTFE below 305° C. could decrease promotion effect of crystallization of PFA. In addition, the case of the heat of crystallization below 50 J/g also could decrease promotion effect of crystallization of PFA. Accordingly, to satisfy the object of the present invention, it is preferable to use a PFA composition, including PTFE having the heat of crystallization of 50 J/g or higher, in injection molding.

Such PTFE can be obtained by decomposition by radiation rays or heat of high molecular weight PTFE, called "molding powder" or "fine powder", having non-melt fluidity, or directly by polymerization of tetrafluoroethylene in the presence of a chain-transfer agent.

As for a specific production method, reference may be made to, for example, JP-B-47-19609 or JP-B-52-38870, as for a radiation-ray decomposition method, and U.S. Pat. No. 3,067,262, U.S. Pat. No. 6,060,167, JP-B-57-22043 or JP-A-7-90024, as for a direct polymerization method.

The composition including the tetrafluoroethylene/fluoroalkoxytrifluoroethylene copolymer of the present invention is capable of melt molding such as melt extrusion molding or injection molding, and the one having the MFR at 372° C.±1° C. preferably over 60 g/10 minutes and 100 g/10 minutes or lower, and more preferably an MFR of 70 to 80 g/10 minutes. The MFR of 60 g/10 minutes or less tends to make difficult to maintain injection pressure till the end of metal mold, and thus makes difficult to provide a molded article having a projection area of 1100 cm$^2$ or more by injection molding, which is obtainable in the present invention. In addition, the MFR over 100 g/10 minutes makes difficult to maintain the shape of a molded article.

To enhance molding property, by an injection molding machine, of a composition including the heat-meltable tetrafluoroethylene/fluoroalkoxytrifluoroethylene copolymer of the present invention, having the MFR over 60 g/10 minutes, it is desirable to decrease PTFE to be mixed as less as possible, however, the upper limit value of the addition amount of PTFE is not limited. In general, with increase in content of PTFE, injection molding property tends to decrease, and the content of PTFE over 10% by weight enhances chemical resistance of the obtained injection molded article accompanying with increase in the content, however, could cause decrease in mechanical strength (flex life), separation of PTFE and PTA, coagulation of PTFE and delamination.

On the other hand, with increase in the content of PTFE, there is observed tendency of increase in crystallinity of the composition, therefore, the content of PTFE is 0.01 to 50% by weight, preferably 0.01 to 30% by weight, more preferably 0.01 to 10% by weight, and still more preferably 0.05 to 5% by weight, although it depends on the MFR of the tetrafluoroethylene/fluoroalkoxytrifluoroethylene copolymer. The case where the addition amount of PTFE is below 0.01% by weight makes releasing of the injection molded article from a metal mold difficult, because ejection of the injection molded article becomes difficult.

Since PTFE to be mixed in the present invention has extremely high compatibility with the tetrafluoroethylene/fluoroalkoxytrifluoroethylene copolymer in a molten state, it easily disperses into said copolymer in melt kneading or melt extrusion, to give extremely uniform composition. Although the shape of PTFE to be mixed is, therefore, not especially limited, it is preferable to be a dispersion of fine particles having an average particle size of 0.05 to 1.0 μm, or powder having an average particle size of several μm to several tens μm, in view of workability.

As a mixing method for PTFE in the present invention, any of known methods can be utilized, such as a melt kneading method, a dry blend method of PTFE powder with pellets or powder of the tetrafluoroethylene/fluoroalkoxytrifluoroethylene copolymer, and a wet-type blend method of a PTFE powder and/or a PTFE dispersion with a dispersion of said copolymer.

In addition, such a method may also be adopted that PTFE particles are dispersed in a polymerization medium in a PFA polymerization tank in advance, and then polymerization of PFA is initiated to obtain a composition as PFA particles containing PTFE.

For example, such a fluoropolymer particle may be used that has a multilayer structure composing PTFE and PFA having different melting point, and has a multilayer structure in which at least one layer composed of a fluoropolymer having higher melting point than the fluoropolymer at the most outer layer is possessed as an inner layer, as described in JP-A-2007-320267. It is preferable that the fluoropolymer having a multilayer structure by at least two kinds of fluoropolymers having different melting point comprises 90 to 5% by weight of a fluoropolymer at the most outer layer, and 10 to 95% by weight of a higher melting point fluoropolymer at the inner layer. Ratio of the most outer layer and the inner layer can be selected in consideration of desired chemical resistance/gas permeability, linear thermal expansion coefficient, maximum strength, elongation or the like. In view of maintaining the degree of crystallinity of the injection molded article of the fluoropolymer, content of the higher melting point fluoropolymer is preferably 10% by weight or more. In addition, in view of mechanical strength (maximum strength, elongation or the like) of the obtained injection molded article of the fluoropolymer, it is preferable that content of a lower melting point fluoropolymer is 5% by weight or more.

The MFR of the composition containing the melt moldable tetrafluoroethylene/fluoroalkoxytrifluoroethylene copolymer of the present invention is preferably over 60 g/10 minutes and 100 g/10 minutes or lower, and more preferably 70 to 100 g/10 minutes. Although a composition having the smaller MFR provides the more superior durability, the case where the MFR of the composition is 60 g/10 minutes or lower could make melt molding difficult when an article having a complicated shape and deep depth is molded by injection, because of sticking or the like of the injection molded article to a metal mold, which not only makes mold release difficult but also generate many troubles such as fracture of thin parts by an ejector. In addition, the upper limit of MFR of the composition, which is capable of maintaining good durability, is 100 g/10 minutes, and the MFR over this value could cause decrease in flex life, and deteriorate durability of the obtained injection molded article.

Since the composition containing the melt moldable tetrafluoroethylene/fluoroalkoxytrifluoroethylene copolymer of the present invention, having an MFR over 60 g/10 minutes, is capable of molding by lower injection pressure as compared with a conventional PFA and is superior in mold release characteristics from a metal mold, a large-size injection molded article can be molded by injection molding using said composition, which has a complicated shape and is particularly superior in heat resistance and chemical resistance, as well as dimensional accuracy, as a member of substrate processing apparatus. For example, the injection molded article, having a thickness of 4 mm, and an injection area diffusion ratio of 3000 or larger, can be obtained using an injection molding machine having a clamping pressure of 800 tons class.

In performing injection molding, it is desirable to maintain injection pressure at about 400 kg/cm$^2$ to 800 kg/cm$^2$. The case where injection pressure is over 800 kg/cm$^2$ may increase possibility of burr generation or over packing. In addition, the case where injection pressure is less than 400 kg/cm$^2$ could make short or dimensional variation larger.

A projection area of the injection molded article of the present invention is preferably 1100 cm$^2$ or more. The projection area in the present invention means an area viewable, when the injection molded article is viewed from a nozzle of an injection molding machine, that is, a projection area of a nozzle direction. A projection area of a conventionally known melt injection molded article of a fluoropolymer has been below 1100 cm$^2$, and there has not been known the melt injection molded article of a fluoropolymer having a projection area of 1100 cm$^2$ or more. The injection molded article of the present invention, having a projection area of 1100 cm$^2$ or more, is a large-size injection molded article, which hardly generate crack and is superior in dimensional stability and ejection easiness.

The injection molded article of the present invention is further preferable to have an injection area diffusion ratio of 3000 or larger. The injection area diffusion ratio in the present invention means the injection area diffusion ratio in a direction orthogonal to an injection direction, that is, ratio of an opening area of a nozzle tip part and the projection area of the injection molded article. The case where the injection area diffusion ratio is less than 3000 deteriorates stability of weight of the injection molded article, that is, increases dimensional variation, and thus it is not preferable.

Explanation will be given below on opening area of a nozzle tip part to be used in determining injection area diffusion ratio in the present invention and the projection area of the injection molded article, with reference to drawings.

FIG. 1 is one example of a metal mold to obtain the injection molded article of the present invention, and shows a cross-sectional view of a metal mold in a closed state. In FIG. 1, there is indicated in a state including a nozzle 1, which is an injection mouthpiece attached at the tip of a heating cylinder of an injection molding machine. The opening part of the nozzle tip part is a tip part "a" of the nozzle 1, and the opening area of the nozzle tip part means an area of the inside opening part of the tip part "a". A molten fluoropolymer composition injected from the nozzle 1 passes through a gate 2 via a sprue 6, to be filled into a cavity 5 inside a metal mold 4. The "x-y" of FIG. 1 is a center line.

Figure 2:
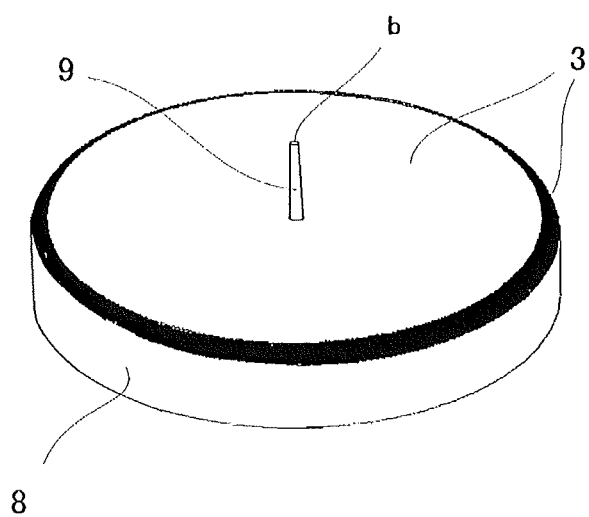
FIG. 2 is a perspective schematic view showing the injection molded article obtained from a metal mold of FIG. 1.

FIG. 2 shows the schematic drawing of a perspective view of a molded article obtained by releasing the metal mold 4 after injection molding.

Figure 3:
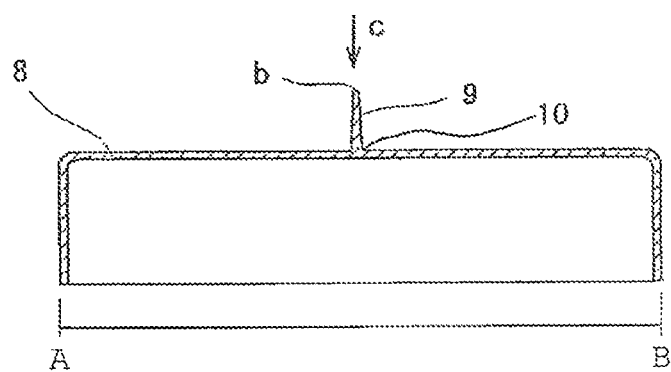
FIG. 3 is a cross-sectional view of the injection molded article of FIG. 2.
Figure 7:
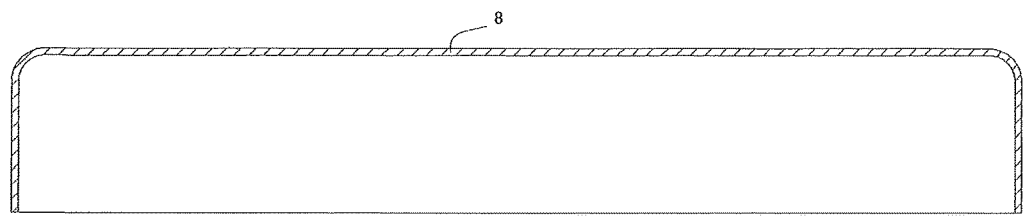
FIG. 7 is a cross-sectional view of a bowl-shape molded article of the present invention.

FIG. 3 is a cross-sectional view of a molded article 8 obtained. In FIG. 3, a resin solidified at a sprue and a gate is present. Usually, the resin solidified at a sprue and a gate is also called a sprue and a gate, respectively, therefore, in FIG. 3, the sprue of the solidified resin is represented by 9. The sprue 9 is eliminated when making a final molded article, to provide a molded article as shown in FIG. 7. In FIG. 3, a nozzle direction of an injection molding machine is a direction of an arrow mark c, therefore a plane of projection of the molded article viewable when viewed from a direction of the arrow mark c is formed by a portion represented by 3 of FIG. 2. In FIG. 2, to make clear a portion represented by 3, the outline of said area is colored by black. A plane of projection is a range of A-B. An area occupied by a plane of projection is an injection projection area, and ratio of the injection projection area and an opening area of the tip part "a" of the nozzle 1 is calculated as the injection area diffusion ratio.

Figure 4:
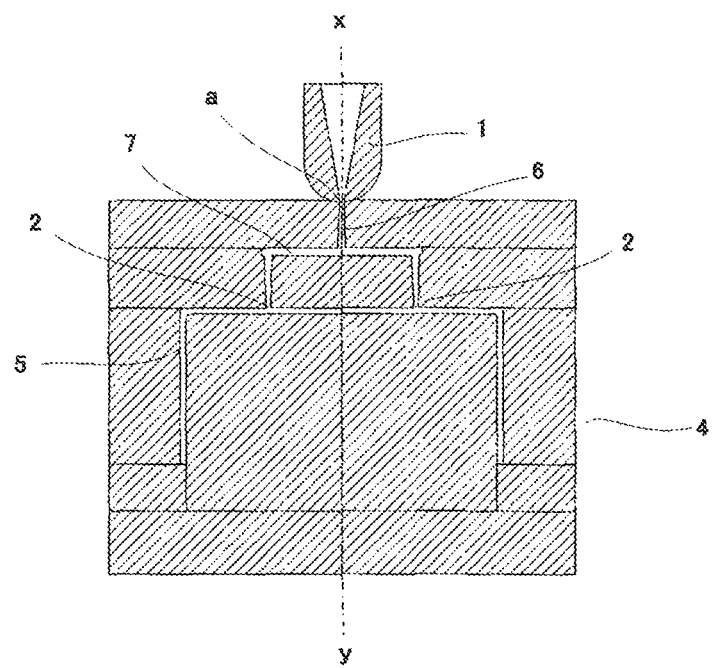
FIG. 4 is a cross-sectional view showing other example of a metal mold to obtain an injection molded article of the present invention.

FIG. 4 shows another example of a metal mold to obtain an injection molded article of the present invention, and is a cross-sectional view of a metal mold in a closed state. In FIG. 4, a molten fluoropolymer composition injected from the nozzle 1 passes through the gate 2 via the runner 7 from the sprue 6, to be filled into the cavity 5 inside the metal mold 4. The "x-y" of FIG. 4 is a center line.

Figure 5:
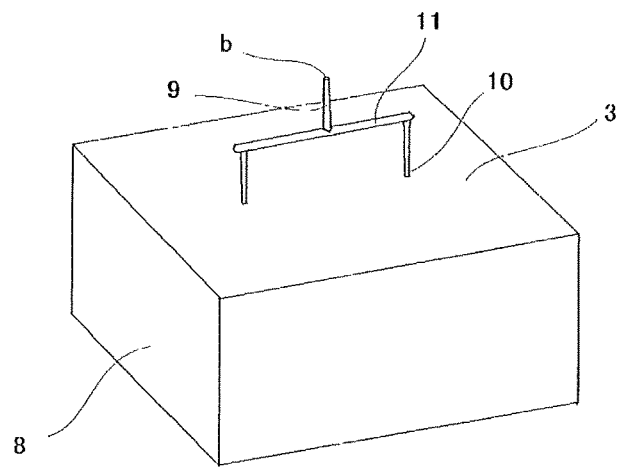
FIG. 5 is a perspective schematic view showing the injection molded article obtained from a metal mold of FIG. 4.
Figure 6:
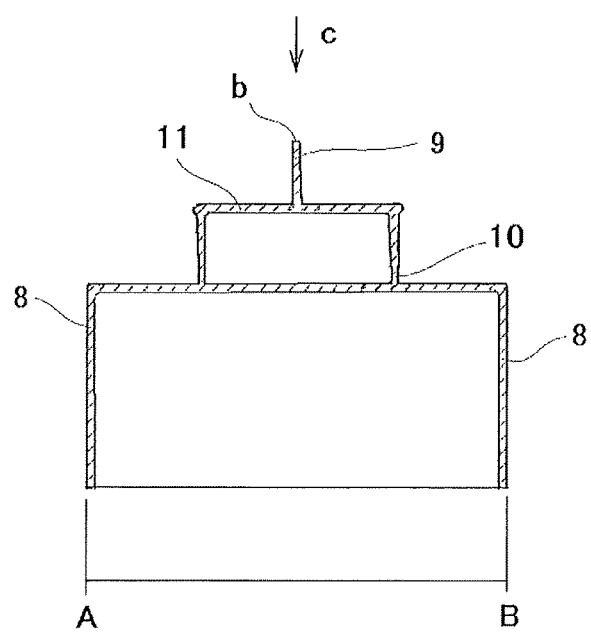
FIG. 6 is a cross-sectional view of the injection molded article of FIG. 5.

In FIG. 5, a perspective view of a molded article obtained by the injection molding method of FIG. 4 is shown, and in FIG. 6, a cross-sectional view of the obtained molded article 8 is shown. In FIG. 6, a sprue 9, a runner 11 and a gate 10 of the solidified resin are present, however, they are eliminated in obtaining a final molded article.

Even in the case where there are two gates, injection area diffusion ratio is determined from plane of projection, which is an area of plane of projection, and opening area of the nozzle tip part. In a molded article of FIG. 5, the plane of projection is formed by a face 3. It should be noted that, also in FIG. 6, the plane of projection is in a range of A-B. The injection projection area ratio is calculated an opening area of the nozzle tip part as an object, irrespective of number of gates.

The tip part b in the sprue 9 of the solidified resin in FIG. 3 and FIG. 6 is a part corresponding to the nozzle tip opening part.

The shape of the large-size injection molded article of the present invention, having a projection area of 1100 cm$^2$ or more, includes a container-shape such as a cylinder-shape, square-tank-shape, a bowl-shape, a box-shape, a basket-shape or the like. The present invention is capable of replacing a product which has been produced by cutting a conventional PTFE injection molded article, and thus it is economically superior, in cost reduction or the like.

Because the injection molded article of the present invention has high degree of crystallinity and is superior in resistance to penetration property of the chemicals, it is extremely advantageous not only in the above processing tank but also in a product to be used under environment where the chemicals is used, and can be used as a member for a semiconductor manufacturing apparatus or a substrate cleaning processing apparatus or a housing thereof.

EXAMPLES

Explanation will be given below still more in detail on the present invention, with reference to Examples and Comparative Examples, however, the present invention should not be limited to these examples.

It should be noted that measurement methods of properties of the present invention, as well as raw material used in Examples and Comparative Examples are as follows.
A. Measurement of Properties
(1) Melt Flow Rate (MFR)

A melt indexer manufactured by Toyo Seiki Co., Ltd., equipped with a corrosion resistant cylinder, die and piston, in accordance with ASTM D-1238-95 was used. After 5 g of a sample was filled in a cylinder having an inner diameter of 9.53 mm which was maintained at 372° C.±1° C. and held for 5 minutes, it was extruded through an orifice having an inner diameter of 2.1 mm and a length of 8 mm, under a load (piston and weight) of 5 kg. Extrusion rate (g/10 minutes) at this time was determined as MFR.

(2) Crystallization Temperature (Tc) and Heat of Crystallization (Hc)

Using a differential scanning calorimeter, a sample was heated from 200° C. to 380° C. at a temperature increasing rate of 10° C./minute, and was held at 380° C. for 1 minute, it was cooled down to 200° C. at a temperature decreasing rate of 10° C./minute to adopt temperature of crystallization peak in obtained crystallization curve as crystallization temperature.

Peak area formed by crystallization peak in the crystallization curve and a straight line drawn between points where the curve departs from base line before the crystallization peak and the curve returns to the base line after the peak was measured to determine heat of crystallization.

(3) Melting Point

A differential scanning calorimeter (Pyris 1-model DSC, manufactured by Perkin Elmer Co., Ltd) was used. 10 mg of sample powder was weighed and charged in an exclusive aluminum pan, crimped using an exclusive crimper, and then stored in a main body of the DSC, and subjected to heating from 150° C. to 360° C. at a temperature increasing rate of 10° C./minute. Melting peak temperature (Tm) was determined from the obtained melting curve at this time.

(4) Ejection Easiness (Mold Release Characteristics)

A product was ejected (mold released) using an ejector pin and an air ejector (air pressure of 0.35 MPa or higher) of a molding metal mold, in combination. In this case, property of mold releasing was judged by visual inspection in accordance with the following standards, mold release characteristics.

○: The injection molded article can be released from a metal mold with maintaining a normal shape.

x: The injection molded article cannot be released from a metal mold, due to sticking of a part of the injection molded article to the metal mold, or a shape of the injection molded article was deformed or fractured.

(5) Crack Resistance

The surface (1 cm×1 cm) and the cross-section of the injection molded article at three positions within 5 cm from the gate center were observed using a polarizing microscope, in a magnification of 100 times and 500 times, respectively, to make judgment in accordance with the following standards:

○: No crack (fracture, cleavage) generation at any of surfaces and cross-sections of the three positions.

x: Crack is generated at either of surfaces and cross-sections of the three positions.

(6) Dimensional Stability 8 points at the top panel were measured and compared, using a 3-dimensional measurement device, BRT-A710, manufactured by Mitutoyo Corp., and difference of maximum and minimum heights thereof was compared and used as dimensional stability. Dimensional stability was determined in accordance with the following standards.

○: Difference between the maximum and minimum heights is 1 mm or smaller.

x: Difference between the maximum and minimum heights is over 1 mm.

(7) Roundness

A bowl-like molded article with an external diameter of about ϕ400 to 600 mm was molded by an injection molding method to measure maximum values and minimum values of diameter. Difference between the maximum values and minimum values of diameter was used to determine roundness, in accordance with the following standards.

○: Difference between the maximum and minimum of diameter is 1 mm or smaller.

x: Difference between the maximum and minimum of diameter is over 1 mm.

B. Raw Materials

Raw materials used in Examples and Comparative Examples in the present invention are as follows.

(1) PFA1

A composition composed of 99.5% by weight of PFA powder (average particle size of 300 μm, melting point of 305° C., and melt flow rate of 70 g/10 min), and 0.5% by weight of PTFE powder (average particle size of 10 μm, melting point of 327° C., melt flow rate of 0.15 g/10 min, and heat of crystallization of 50 J/g) were charged into a hopper of an extruder (40 mm diameter twin screw extruder, manufactured by PLAGIKEN Co., Ltd.), which was heated at 380° C., to process into pellets with φ 2 mm and length of 2 mm. The obtained pellet was referred to as PFA1 (melting point of 311° C., melt flow rate of 68 g/10 min).

(2) PFA2

Tetrafluoroethylene/fluoroalkoxytrifluoroethylene copolymer (PFA) (pellet like having φ 2 mm and length of 2 mm, melting point of 308° C., melt flow rate of 61 g/10 min).

(3) PFA3

Tetrafluoroethylene/fluoroalkoxytrifluoroethylene copolymer (PFA).

PFA 420HPJ, manufactured by DuPont-Mitsui Fluorochemicals Co., Ltd. (pellet shaped having φ 2 mm and a length of 2 mm, melting point of 307° C., melt flow rate of 26 g/10 min)

(4) PFA4

Tetrafluoroethylene/fluoroalkoxytrifluoroethylene copolymer (PFA).

PFA, 440HPJ, manufactured by DuPont-Mitsui Fluorochemicals Co., Ltd. (pellet shaped having φ 2 mm and length of 3 mm, melting point of 308° C., melt flow rate of 14 g/10 min)

C. Molding Method

Injection molding was performed using resins shown in the following Examples and Comparative Examples, and injection molding machines having a clamping pressure of 850 ton and 1300 ton, under conditions of a cylinder temperature of 375 to 400° C., metal mold temperature of 160 to 220° C., injection speed of 15 to 25 mm/sec, as well as under conditions shown in the following Table 1, to obtain a bowl-shape injection molded article with an exterior diameter size of φ 400 to 600 mm, and to calculate injection area diffusion ratio.

TABLE 1

| Condition | Clamping pressure | Product cross-section area (Projection area) | Molded article weight | Injection area diffusion ratio |
|---|---|---|---|---|
| A | 850 T | 1,130 cm$^2$ | about 3,800 g | 4,000 |
| B | 1,300 T | 2,800 cm$^2$ | about 4,000 g | 10,000 |

Examples 1 and 2, Comparative Examples 1 and 2

The injection molded articles were obtained using resins and mixing ratios shown in Table 2, and under molding conditions described in the same Table.

Injection molding property, ejection easiness (mold release characteristics), crack resistance and dimensional stability of the obtained injection molded articles were measured. Results are shown in Table 2.

TABLE 2

| | Kind of PFA | MFR (g/10 min) | Addition amount of PTFE (wt %) | Injection molding property Condition | | Ejection easiness Condition | | Dimensional stability Condition | | Crack resistance Condition | |
|---|---|---|---|---|---|---|---|---|---|---|---|
| | | | | A | B | A | B | A | B | A | B |
| Example 1 | PFA 1 | 68 | 0.5 | ○ | ○ | ○ | ○ | ○ | ○ | ○ | ○ |
| Example 2 | PFA 2 | 61 | X | ○ | ○ | ○ | ○ | ○ | ○ | ○ | ○ |
| Comp. Example 1 | PFA 3 | 26 | X | ○ | X | X | — | X | — | X | — |
| Comp. Example 2 | PFA 4 | 14 | X | X | X | — | — | — | — | — | — |

INDUSTRIAL APPLICABILITY

The present invention is capable of providing, by injection molding, a large-size injection molded article having a complicated shape, which is superior, in particular, in heat resistance and chemical resistance, as well as dimensional accuracy, as a member for substrate processing apparatus.

A large-size injection molded article provided by the present invention is particularly suitable for a member for substrate processing apparatus.

A large-size injection molded article provided by the present invention makes possible to obtain by injection molding such a product that has been obtained conventionally by cutting a large-size material of PTFE, such as a processing tank in a semiconductor processing apparatus for performing processing by being supplied multiple kinds of processing liquids, and it makes possible to reduce product cost in a large degree, as compared with a conventional product, because of enabling to significantly shorten steps necessary to obtain the injection molded article, as well as significantly reduce waste.

In addition, in accordance with an injection molding method of a large-size injection molded article of the present invention, it has become possible to perform molding under low injection pressure, therefore compact sizing of a molding machine and a metal mold has also become possible, and thus further product cost reduction has become possible.

REFERENCE SIGNS LIST 1. nozzle
a. opening part of a nozzle tip 2. gate
3. face of a molded part
4. metal mold
5. cavity
6. sprue
7. runner
8. molded part
9. sprue
10. gate
11. runner
b. tip part of a sprue 9
c. direction of a nozzle
A-B. plane of projection

The invention claimed is:

1. An injection molded article having a trace of a gate at the time of molding and having a projection area of 1100 cm$^2$ or more and being obtained by injection molding a composition containing a heat-meltable fluoropolymer,
wherein the composition contains a tetrafluoroethylene/fluoroalkoxytrifluoroethylene copolymer as the heat-meltable fluoropolymer, and further a polytetrafluoroethylene in an amount of 0.05 to 10% by weight, relative to the composition,
wherein the projection area of the article is obtained by orthogonal projection of the injection molded article in an injection direction which is a direction perpendicular to the trace of the gate,
wherein the injection area diffusion ratio in a direction orthogonal to an injection direction is 3000 or larger, and
wherein no crack both of fracture and cleavage of the injection molded article is detected when a surface having a size of 1 cm×1 cm and a cross-section of the injection molded article at three positions within 5 cm from a gate center are observed using a polarizing microscope, in a magnification of 100 times and 500 times, respectively.

2. The injection molded article according to claim 1, wherein the injection area diffusion ratio in the direction orthogonal to the injection direction is 10,000 or larger.

3. The injection molded article according to claim 1, wherein the injection molded article is an article having a cylinder-shape, a bowl-shape, a box-shape or a basket-shape.

4. The injection molded article according to claim 1, which comprises being used as a member or a housing thereof, for a semiconductor manufacturing apparatus or a substrate cleaning processing apparatus.

5. The injection molded article according to claim 1, wherein melt flow rate of the composition containing the heat-meltable fluoropolymer is over 60 g/10 minutes and not more than 68 g/10 minutes.

6. The injection molded article according to claim 1, wherein the tetrafluoroethylene/fluoroalkoxytrifluoroethylene copolymer has a melt flow rate over 60 g/10 minutes, and the polytetrafluoroethylene has a crystallization temperature of 305° C. or higher and a heat of crystallization of 50 J/g or higher.

7. The injection molded article according to claim 1, wherein the tetrafluoroethylene/fluoroalkoxytrifluoroethylene copolymer is a tetrafluoroethylene/perfluoro(alkyl vinyl ether) copolymer having a melt flow rate over 60 g/10 minutes.

8. The injection molded article according to claim 6, wherein the tetrafluoroethylene/fluoroalkoxytrifluoroethylene copolymer is a tetrafluoroethylene/perfluoro(alkyl vinyl ether) copolymer.

9. The injection molded article according to claim 1, wherein the injection molded article comprises a flat-plate top having a flat top surface and a side wall, and wherein the injection molded article has a difference between a height$_{max}$ and a height$_{min}$ of 1 mm or smaller, the height$_{max}$ and a height$_{min}$ being obtained among heights measured at 8 points on the top surface of the article, using a 3-dimensional measurement device.

* * * * *